United States Patent [19]
Hwang et al.

[11] Patent Number: 5,935,761
[45] Date of Patent: Aug. 10, 1999

[54] PHOTOSENSITIVE RESIN COMPOSITION

[75] Inventors: Jae-Young Hwang, Kyungsangbuk-do; Byeong-Il Lee, Kyungki-do; Kie-Jin Park, Busan, all of Rep. of Korea

[73] Assignee: Kolon Industries, Inc., Seoul, Rep. of Korea

[21] Appl. No.: 09/091,162

[22] PCT Filed: Nov. 7, 1996

[86] PCT No.: PCT/KR96/00198

§ 371 Date: Jun. 9, 1998

§ 102(e) Date: Jun. 9, 1998

[87] PCT Pub. No.: WO97/23809

PCT Pub. Date: Jul. 3, 1997

[30] Foreign Application Priority Data

Dec. 21, 1995 [KR] Rep. of Korea ............... 95-53460

[51] Int. Cl.$^6$ ...................................................... G03C 5/00
[52] U.S. Cl. .................................. 430/281.1; 430/285.1; 430/287.1; 430/288.1; 430/908
[58] Field of Search ............................ 430/285.1, 287.1, 430/288.1, 908, 281.1

[56] References Cited

U.S. PATENT DOCUMENTS

| | | | |
|---|---|---|---|
| 4,961,960 | 10/1990 | Iimure | 427/54.1 |
| 5,539,064 | 7/1996 | Hashimoto et al. | 525/529 |

FOREIGN PATENT DOCUMENTS

| | | |
|---|---|---|
| 0321618 | 6/1989 | European Pat. Off. . |
| 0321618 A1 | 6/1989 | European Pat. Off. . |
| 361228007 | 10/1986 | Japan . |
| 401159637 | 6/1989 | Japan . |
| 407146550 | 6/1995 | Japan . |

OTHER PUBLICATIONS

Database WPIL on Questel, week 9531, London: Derwent Publications Ltd., AN 95–237783, JP 07–146 550 A (Fuji Photo Film Co., Ltd.), abstract.

Database WPIL on Questel, week 8931, London: Derwent Publications Ltd., AN 89–223749, JP 01–159 637 A (Daicel Chem. Ind. KK), abstract.

Database WPIL on Questel, week 8647, London: Derwent Publications Ltd., AN 86–308838, JP 61–228 007 A (Fuji Photo Film KK), abstract.

*Primary Examiner*—John A. McPherson
*Assistant Examiner*—Rosemary Ashton

[57] ABSTRACT

Disclosed herein is a photosensitive resin composition comprising a photopolymerizable monomer, thermoplastic polymeric binder and photoinitiator, wherein said photopolymerizable monomer comprises as least one species of water-soluble monomer and at least one species of water-insoluble monomer, both with two or more unsaturated reactive groups and said reactive groups in total range from 0.5 to 1.5 mole per kg of the solid content when calculated in accordance with the following formula (I):

$$\#M = \sum_{i=1}^{k} M_i N_i \qquad (I)$$

wherein #M represents the total amount of said reactive group per kg of the solid content of said composition; $M_i$ represents the mole number of a photo-polymerizable monomer i per kg of said composition; $N_i$ represents the number of the reactive groups in a photo-polymerizable monomer i; and k stands for the total number of the photo-polymerizable monomer contained in said composition.

4 Claims, No Drawings

PHOTOSENSITIVE RESIN COMPOSITION

This is the national phase under 35 U.S.C. §371 of prior PCT International Application No. PCT/KR96/00198 which has an International filing of Nov. 7, 1996 which designated the United States of America, the entire contents of which are hereby incorporated by reference.

BACKGROUND OF THE INVENTION

1. Field of the Invention

The present invention relates to a photosensitive resin composition useful to manufacture the dry film photoresist for circuit design of printed circuit board (hereinafter referred to as "PCB").

2. Description of the Prior Art

Usually, dry film photoresist is prepared by coating a photosensitive resin composition in admixture with organic solvent on a base film, followed by drying it and then laminating a protecting film on the dried photoresist film. In order to manufacture a PCB, such dry film photoresist is uniformly applied on an epoxy sheet overlaid with a copper film or coated with copper, with the aid of a laminator. For this purpose, the dry film photoresist is first peeled off the protecting film, then stuck to the copper overlay, together with the base film. A desired circuit (photo-tool) is allowed to adhere closely to the base film which is then exposed to uv. The parts illuminated are cured while the covered parts remain uncured. Following removal of the base film, application of a developing solution removes the uncured parts from the board with the cured parts remaining to form a circuit.

Significant properties necessary to dry film PCB include rapid developing speed, flexibility of the film to be exposed, and resistance to plating chemicals. Of the components consisting of photosensitive resin composition photo-polymerizable monomer has a great influence on such properties, so that careful consideration must be taken to select it.

It is well known that a high degree of cure allows the photosensitive resin to be more resistant to chemicals. The high degree of cure may be achieved by utilizing photo polymerizable monomers of low molecular weight the representative examples of which include ethylene glycol di-(meth)acrylate, diethylene glycol di-(meth)acrylate, pentaerythritol triacrylate, trimethylol propane tri-(meth)acrylate, etoxylated trimethylol propane tri-(meth)acrylate, propoxylated trimethylol propane tri-(meth)acrylate, and hydroxy di-(meth)acryloxypropane.

Where such low molecular weight monomers are used in large quantities, the reactive end group of the monomer increases in number, leading to large free volume in the photosensitive resin composition. As the free volume increases, the developing speed increases because the developing solution can easily penetrate into the photosensitive resin. However, the overcure attributed to the raise in the number of the reactive end group leads the film to brittleness and frangibility.

Alternatively, photo-polymerizable monomers containing phenyl group are used to provide good chemical resistance for the photo-polymerizable resin. Typical examples of phenyl group-containing photo-polymerizable monomer include compounds that contain bisphenol A intramolcularly, such as 2,2-bis[4-(acryloxydiethoxy) phenyl]propane and 2,2-bis[4-(methacryloxydiethoxy) phenyl[propane. The abundance of such phenyl-containing monomers in photosensitive resin composition retards the penetration of weak alkaline aqueous solution, deleteriously affecting the developing speed.

In order to raise the developing speed, photo-polymerizable monomers carrying ethylene glycol unit can be added. As mentioned above, the use of low molecular weight monomers with few ethylene glycol units results in fragile film. On the other hand, photo polymerizable monomers with many ethylene glycol units enable the dry film photoresist to be dissolved in water, increasing the developing speed because the ethylene glycol is hydrophilic. In addition, the density of cure can be maintained at such levels as can induce high toughness after exposure to UV. However, the ethylene glycol leads to a significant decrease in plating chemical resistance. As will be described in greater detail later on, the plating chemical resistance can be improved by use of a combination of monomers carrying ethylene glycol and monomers carrying bisphenol A. Each monomer alone is found to be insufficient.

The flexibility of a dry film following exposure to light depends largely on the degree of cure and the structure of monomers used. For example, a large population of curable monomers in the composition causes frequent cure opportunities, resulting in poor flexibility. On the other hand, a small number of curable monomers provides a flexible film but inferior in plating chemical resistance. In manufacturing PCB, the flexibility of the film cured by being exposed to light largely determines its tentability, an ability to block up holes. The better the flexibility, the higher the tentability, resulting in an improvement in productivity.

SUMMARY OF THE INVENTION

Therefore, it is an object of the present invention to overcome the above problems encountered in prior-arts and to provide a photosensitive resin composition useful to prepare photoresist which is rapid in developing speed and very flexible and resistant to plating chemicals.

In accordance with the present invention, the above object could be accomplished by providing a photosensitive resin composition comprising photo-polymerizable monomer, thermoplastic polymeric binder and photoinitiator, wherein said photo polymerizable monomer comprises at least one species of water-soluble monomer and at least one species of water-insoluble monomer, both carrying two or more unsaturated reactive groups and said water-soluble monomer amounting to 3–15% by weight based on the solid content of said composition, and said reactive groups in total range from 0.5 to 1.5 mole per kg of the solid content when calculated in accordance with the following formula I:

$$\#M = \sum_{i=1}^{k} M_i N_i$$

wherein #M represents the total amount of said reactive group per kg of the solid content of said composition; $M_i$ represents the mole number of a photo-polymerizable monomer i per kg of said composition; Ni represent the number of the reactive groups in a photo-polymerizable monomer i; and k stands for the total number of the photo-polymerizable monomer contained in said composition.

DETAILED DESCRIPTION OF THE INVENTION

According to the present invention, water-soluble, photo-polymerizable monomers carrying ethylene glycol are used to improve flexibility of cured parts. Preferred but non-limitative examples of such water-soluble monomers include 2.2-bis[4-(acryloxy polyethoxy)phenyl]propane and 2,2-bis[4-(methacryloxy polyethoxy)phenyl]propane, both having an ethylene glycol unit number ranging from 25–40, and polyethylene glycol di-(meth)acrylate having an ethylene glycol unit number of 8–15. For example, as the number of the ethylene glycol units in the water-soluble, photo-polymerizable monomer increases, the water solubility becomes improved but the plating chemical resistance is lowered. On the other hand, a small number of ethylene glycol units provide better plating chemical resistance but worse developability and flexibility.

In accordance with the present invention, water-insoluble, photo-polymerizable monomers may be used. Concrete examples of the water-insoluble monomers include ethylene glycol di-(meth)acrylate, diethylene glycol di-(meth)acrylate, triethylene glycol di-(meth)acrylate, tetraethylene glycol di-(meth)acrylate, pentaerythritol tri-(meth)acrylate, trimethylol propane tri-(meth)acrylate, ethoxylated trimethylol propane tri-(meth)acrylate, propoxylated trimethylol propane tri-(meth)acrylate, polypropylene glycol di-(meth)acrylate, hydroxy di-(meth)acrylate, polypropylene glycol di-(meth)acrylate, hydroxy di-(meth)acrylate, 2,2-bis[4-(acryloxy diethoxy)phenyl]propane, 2,2-bis(4-(acryloxy polyethoxy)phenyl]propane, 2,2-bis[4-(methacyloxy diethoxy)phenyl]propane, 2,2-bis[4-(methacryloxy polyethoxy)phenyl]propane, and combinations of at least two species thereof. It will be appreciated that the present invention is not limited to these compounds and the analogues thereof may be used.

In order to enhance the flexibility of the dry film, the total amount of the reactive end groups (#M) of the photo-polymerizable monomers must, when calculated according to Formula I, range from 0.5 to 1.5 mol/kg, based on the solid content of the composition of the present invention and more preferably from 0.8 to 1.2 mol/kg. For example, if #M is below 0.5 mol/kg, the dry film shows poor chemical resistance. On the other hand, if #M exceeds 1.5 mol/kg, the flexibility of the dry film is lowered, which leads to poor tentability.

Besides photo-polymerizable monomer, other essential components, such as polymeric binder and photoinitiator, are involved in the photosensitive resin composition for dry film photoresist. Optionally, additives, such as adhesion promoter, thermal polymerization inhibitor, dye and the like, may be used in combinations.

For polymeric binder, there is preferably selected a thermoplastic linear polymer that has a weight-average molecular weight (Mw) of about 10,000 to 400,000 and a glass transition temperature (Tg) of 40 to 80° C. It is preferably added at an amount of about 50 to 80% by weight, based on the solid content of the photosensitive resin composition.

Such polymeric binder may be prepared from addition polymerizable monomers, including alkylacrylic acid or alkylmethacrylic acid, such as methacrylic acid, butylacrylic acid or methylmethacrylic acid; styrene and/or the derivatives thereof; esters, such as acrylic ester and methacrylic acid ester. Preferably, an acidic component, such as acrylic acid, methacrylic acid, maleic acid or crotonic acid, is added to the polymeric binder, to provide developability in aqueous alkaline solutions.

Suitable photoinitiator to the composition of the invention includes substituted or non-substituted polynuclearquinones, such as 2-ethyl anthraquinone, 2-t-butyl anthraquinone, octamethyl anthraquinone, 1,2-benzanthraquinone, 2,3-benzanthraquinone, 2-phenylanthraquinone, 2,3-diphenylanthraquinone, 1-chloroanthraquinone, 2-chloroanthraquinone, 2-methylanthraquinone, 1,4-naphthaquinone, 9,10-phenanthraquinone and 1,2-dimethylanthraquinone; aromatic ketones, such as benzophenone, Michler,s ketone (4,4-bis(dimethyl amino)benzophenone), 4,4-bis(diethyl amino)benzophenone and 4-methoxy-4-bisdimethyl aminobenzophenone; benzoin ethers, such as methylbenzoin and ethylbenzoin; and 2,4,5-triarylimidazole dimer. Additional examples include substituted or non-substituted thioxantones, such as 2-chlorothioxantone and 2,4-diethylthioxantone; aliphatic tert-amines, such as methyl diethanol amine; and aromatic tert-amines.

The above-mentioned photoinitiators, activated by light, may be used alone or in combinations of at least 2 species. The amount of such photoinitiator preferably ranges from about 0.5 to 10% by weight based on the total weight of the photoresist components. For example, if too little photoinitiator is used, the cure does not occur sufficiently by light. On the other hand, if the photoinitiator is added at an amount of more than 10% by weight, the composition is too sensitive to light for a worker to handle it.

In addition, the photosensitive resin composition useful for dry film photoresist may comprise various additives, such as adhesion promoter, dye and thermal polymerization inhibitor. Adhesion promoter serves to increase the adhesion to the copper plate. Representative is benzotriazole. For dye, Victoria blue, methylene blue, crystal violet or Malachite Green may be used while hydroquinone, hydroquinone monoethyl ether, and t-butyl catechol as thermal polymerization inhibitor.

Typically, dry film photoresist is prepared by coating a photosensitive resin composition combined with an organic solvent, drying it and laminating a protecting film on the dried photoresist layer.

Any film that is durable at 100° C. or more and transparent can be used as the base film. Polyester (polyethylene terephthalate) films, nylon films, polyimide films and polycarbonate films are usually used with preference to polyethylene terephthalate films.

In addition to defending the photoresist layer from foreign substances, the protecting film serves, when is rolling the dry film photoresist, to prevent the layers from adhering to each other. Polyolefinic films, such as polyethylene or polypropylene, are employed.

For developing the dry film photoresist, an organic solvent, such as 1,1,1-trichloroethane, or a weak alkline aqueous solution, such as a solution of sodium carbonate in water, is used. In recent times, there has been developed dry film photoresist that is developable with such an weak alkaline aqueous solution. After being provided with a circuit, a substrate is processed into a PCB through plating, etching and delamination. A photosensitive resin composition developable with a weak alkali aqueous solution is found to be generally resistant to acidic copper plating solution but the chemical resistance to solder plating solution varies with the composition.

A better understanding of the present invention may be obtained in light of the following examples which are set forth to illustrate, but are not to be construed to limit, the present invention.

In the following examples, the mark "★" stands for water-soluble photo-polymerizable monomer and "★★" for water-insoluble photo-polymerizable monomer.

EXAMPLE I

Photosensitive Resin Composition

A methylmethacrylate (50 %)/ethylacrylate (30 %)/methacrylic acid (20%) copolymer as a polymeric binder was used at an amount of 65 parts by weight. This polymeric binder had a weight-average molecular weight (Mw) of about 70,000 as determined by GPC (waters, column: Shodex KF Series; standard sample: standard polystyrene; RI detector). For photo-polymerizable monomer, 12 parts by weight of ★2,2-bis[4-(methacryloxy polyethoxy)phenyl] propane with a molecular weight of 1,684 and a molecular average ethylene glycol unit number (hereinafter referred to as "$N_{EG}$ of 30), 8 parts by weight of ★★tetraethylene glycol dimethacrylate with a molecular weight of 330, and 7 parts by weight of etoxylated trimethylol propane triacrylate with a molecular weight of 428 were added. This mixture was added with 4 parts by weight of benzophenone, 0.5 parts by weight of Michler's ketone, 0.05 parts by weight of Victoria blue, 0.05 parts by weight of hydroquinone monomethyl ether, 0.5 parts by weight of benzotriazole, and 100 parts by weight of methylethylketone and homogeneously mixed, to prepare a photosensitive resin composition with the total amount of reactive end group (#M) of 1.15 mole/kg based on the solid content.

The composition thus obtained was coated on a polyethylene terephthalate film 25 μm thick and dried at 80° C. to give a photosensitive film 40 μm thick. Using a rubber role, a polyethylene film with a thickness of 30 μm was laminated to the photosensitive layer.

COMPARATIVE EXAMPLE I AND II

The procedure of Example I was repeated using such photo-polymerizable monomers as follow:
Comparative Example I: Composition of Photo-Polymerizable monomers

| | |
|---|---|
| *2,2-bis[4-(methacryloxy polyethoxy)phenyl]propane (Mw = 1,684, $N_{EG}$ = 30) | 5 parts |
| **tetraethylene glycol dimethacrylate (Mw = 330) | 7 parts |
| **etoxylated trimethylolpropane triacrylate (Mw = 428) | 15 parts |
| Total amount of the reactive end group(#M) | 1.58 mole/kg |

Comparative Example II: Composition of Photo-Polymerizable monomers

| | |
|---|---|
| *2,2-bis[4-(methacryloxy polyetoxy)phenyl]propane (Mw = 1,684, $N_{EG}$ = 30) | 15 parts |
| **2,2-bis[4-(methacryloxy polyetoxy)phenyl]propane (Mw = 804, $N_{EG}$ = 10) | 5 parts |
| **polypropyleneglycol diacrylate (Mw = 808) | 7 parts |
| Total amount of the reactive end group(#M) | 0.47 mole/kg |

EXAMPLE II

A photosensitive resin composition with the total amount of reactive end group (#M) of 0.88 mole was prepared from 65 parts by weight of methylmethacrylate (40% )/2-ethylhexylacrylate (20%)/styrene(20%) methacrylic acid (10%) acrylic acid(10%) copolymer having Mw=50,000, 8 parts by weight of ★2,2-bis[4-(methacryloxy polyethoxy) phenyl)propane having a molecular weight of 1,684 and an $N_{EG}$ of 30, 8 parts by weight of ★★2,2-bis[4-(methacryloxy polyethoxy)phenyl propane having a molecular weight of 804 and an $N_{EG}$ of 10, 8 parts by weight of ★★polypropyleneglycol diacrylate having a molecular weight of 536, 3 parts, by weight of hydroxydimethacryloxypropane, 4 parts by weight of benzophenone, 0.5 part by weight of Michler's ketone, 0.05 part by weights of Victoria blue, 0.5 part by weight of benzotriazole, 0.05 part by weight of hydroquinone monomethyl ether, and 100 parts by weight of methyl ethyl ketone, and the remainder of the procedure of Example I was repeated.

COMPARATIVE EXAMPLE III

The procedure of Example I was repeated using such photo-polymerizable monomers as follow:
Composition of Photo-Polymerizable monomers

| | |
|---|---|
| *2,2-bis[4-(methacryloxy polyethoxy)phenyl]propane (Mw = 1,684, $N_{EG}$ = 30) | 2 parts |
| **2,2-bis[4-(methacryloxy polyethoxy)phenyl]propane (Mw = 804, $N_{EG}$ = 10) | 10 parts |
| **ethoxylated trimethylolpropane triacrylate (Mw = 428) | 8 parts |
| **polypropyleneglycol diacrylate (Mw = 808) | 7 parts |
| Total amount of the reactive end group(#M) | 1.04 mole/kg |

EXAMPLE III

The procedure of Example I was repeated using such photosensitive resin composition as follows:

Photosensitive Resin Composition

| | |
|---|---|
| methylmethacrylate(40%) /2-phenoxyethylacrylate(20%) /methacrylic acid(10%) acrylic / acid(10%) (Mw = 80,000) | 65 parts |
| *2,2-bis[4-(methacryloxy polyethoxy)phenyl]propane (molecular weight:1,684; $N_{EG}$ = 30) | 8 parts |
| *polyethyyleneglycol dimethacrylate (Mw = 536; $N_{EG}$ = 9) | 5 parts |
| *2,2-bis[4-(methacryloxy polyethoxy)phenyl]propane (Mw = 804; $N_{EG}$ = 10) | 7 parts |
| **polypropyleneglycol diacrylate (Mw = 536) | 5 parts |
| **ethoxylated trimethylol propane triacrylate (Mw = 428) | 2 parts |
| benzophenone | 4 parts |
| Michler's ketone | 0.5 part |
| Diamond Green GH | 0.05 part |
| benzotriazole | 0.5 part |
| hydroquinone monomethyl ether | 0.05 part |
| methylethyl ketone | 100 parts |
| Total amount of the reactive end group(#M) | 0.81 mole/kg |

EXAMPLES IV AND V AND COMPARATIVE EXAMPLE IV AND V

The procedure of Example III was repeated using such photo-polymerizable monomers as follows:
Example IV: Composition of Photo-Polymerizable monomers

| | |
|---|---|
| *polyethyleneglycol dimethacrylate (Mw = 536; $N_{EG}$ = 9) | 12 parts |
| **polypropyleneglycol diacrylate (Mw = 536) | 8 parts |
| **ethoxylated trimethylol propane triacrylate (Mw = 428) | 7 parts |
| Total amount of the reactive end group(#M) | 1.3 mole/kg |

EXAMPLE V

Composition of Photo-polymerizable monomers

| | |
|---|---|
| *polyethyleneglycol dimethacrylate (Mw = 736; $N_{EG}$ = 14) | 10 parts |
| **propoxylated trimethylol propane triacrylate (Mw = 470) | 7 parts |
| **2,2-bis[4-(methacryloxy polyethoxy)phenyl]propane (Mw = 804) | 10 parts |
| Total amount of the reactive end group(#M) | 1.0 mole/kg |

Comparative Example IV
Composition of Photo-polymerizable monomers

| | |
|---|---|
| **2,2-bis[4-(methacryloxy polyethoxy)phenyl]propane (Mw = 804, $N_{EG}$ = 10) | 12 parts |
| **tetraethylene glycol dimethacrylate (Mw = 330) | 5 parts |
| **ethoxylated trimethylolpropane triacrylate (Mw = 428) | 10 parts |
| Total amount of the reactive end group(#M) | 1.3 mole/kg |

Comparative Example V
Composition of Photo-Polymerizable monomers

| | |
|---|---|
| *2,2-bis[4-(methacryloxy polyethoxy)phenyl]propane (Mw = 1,684, $N_{EG}$ = 30) | 7 parts |
| *polyethyleneglycol dimethacrylate (Mw = 736, $N_{EG}$ = 14) | 7 parts |
| **trimethylolpropane triacrylate (Mw = 296) | 8 parts |
| **1,6-hexanediol dimethacrylate | 5 parts |
| Total amount of the reactive end group(#M) | 1.52 mole/kg |

Assay

The compositions obtained in Examples and Comparative Examples were tested for developing speed, tentability and plating chemical resistance as will be described below, and the results are given as shown in Table 1 below.

1. Developing Speed

Using a laminator such as that sold, by Western Magnum, identified as "XRL 240", a photosensitive film was laminated on a copper plate polished with a brush, at 100° C. and at a speed of 1 m/min under a pressure of 1 atm.

It was stood at room temperature for 15 min, to cool the surface temperature. Thereafter, developing time was measured by use of a developer such as that sold by Chemcut, identified as "Model 413W". A solution of 1% sodium carbonate in water warmed into 30° C. was used as a developing solution and spayed from a nozzle at a pressure of 1 atm.

2. Tentability

To test rentability, an indicator of film flexibility, dry films were laminated on each side of a copper substrate in which 48 holes with a diameter of 1, 2, 3, 4, 5, 6 and 6.3 mm each were formed. 10 copper substrates per sample were employed. The laminated copper substrates were illuminated for 15 sec in a steper, commercially available from Colight under the tradename of MVL 1330. After exposure, the copper substrates were subjected twice to development for a time twice as long as that measured in the previous developing speed test. The number of broken holes was counted.

3. Plating Chemical Resistance

Circuits 0.3 mm apart from each other were formed on a copper substrate in a similar manner to that of the Tentability test. The copper substrate was treated as follows. The time by which the dry film was delaminted when being applied with the last solution, was measured.

i. immersing in a 10% aqueous sulfuric acid solution at room temperature for 30 min.

ii. washing with water at room temperature for 10 sec., 5 times.

iii. immersing in a solution of 20% fluoroboric acid in water for 30 sec.

iv. immersing in a solution of 40% fluoroboric acid and 3% boric acid in water at room temperature.

TABLE 1

| No. of Exmp. | Developing Time(sec) | Tenting Hole at Break (%) | Plating Chemical Resist.(min) | Comment |
|---|---|---|---|---|
| I | 18 | 0 | 40 | very good |
| II | 18 | 0 | 35 | very good |
| III | 20 | 0 | 40 | very good |
| IV | 22 | 0 | 50 | good |
| V | 23 | 0 | 70 | good |
| C.I | 20 | 0 | 45 | poor in tenting |
| C.II | 20 | 0 | 15 | poor in resist. |
| C.III | 30 | 4 | 35 | poor in tenting |
| C.IV | 40 | 1 | 30 | poor in developing and tenting |
| C.V | 27 | 7 | 50 | poor in tenting |

Compared with Comparative Examples I and II, Example I shows similar developing speed but is superior in tenting hole break and plating chemical resistance.

The developing speed of Comparative Example III is lowered by 50% compared with that of Example 2, showing up to 4% of tenting hole at break.

As apparent from the table, the composition according to the present invention is useful to prepare photoresist superior in developing time and flexibility as well as plating chemical resistance.

The present invention has been described in an illustrative manner, and it is to be understood the terminology used is intended to be in the nature of description rather than of limitation.

Many modifications and variations of the present invention are possible in light of the above teachings. Therefore, it is to be understood that within the scope of the appended claims, the invention may be practiced otherwise than as specifically described.

What is claimed is:

1. A photosensitive resin composition comprising photopolymerizable monomer, thermoplastic polymeric binder and photoinitiator, wherein said photo polymerizable monomer comprises at least one species of water-soluble monomer and at least one species of water-insoluble monomer, both carrying two or more unsaturated reactive groups and said water-soluble monomer amounting to 3–15% by weight based on the solid content of said composition, and said reactive groups in total range from 0.5 to 1.5 mole per kg of the solid content when calculated in accordance with the following formula I:

$$\#M = \sum_{i=1}^{k} M_i N_i$$

wherein #M represents the total amount of said reactive group per kg of the solid content of said composition; $M_i$ represents the mole number of a photo-polymerizable monomer i per kg of said composition; Ni represents the number of the reactive groups in a photo-polymerizable monomer i; and k stands for the total number of the photo-polymerizable monomer contained in said composition.

2. A photosensitive resin composition in accordance with claim 1, wherein said water-soluble, photo-polymerizable monomer is 2,2-bis[4-(acryloxy polyethoxy)phenyl]propane or 2,2-bis{4-(methacryloxy polyethoxy)phenyl]propane having an ethylene glycol unit number of 25–40 in total.

3. A photosensitive resin composition in accordance with claim 1, wherein said water-soluble, photo-polymerizable monomer is a mixture of 2,2-bis[4-(acryloxy polyethoxy) phenyl]propane or 2,2-bis{4-(methacryloxy polyethoxy) phenyl]}propane having an ethylene glycol unit number of 25–40 in total and polyethylene glycol diacrylate or polyethylene glycol dimethacrylate having a ethylene glycol unit number of 8–15 in total.

4. A photosensitive resin composition in accordance with claim 1, wherein said water-insoluble, photo-polymerizable monomer is selected from ethylene glycol di-(meth)acrylate, diethylene glycol di-(meth)acrylate, triethylene glycol di-(meth)acrylate, tetraethylene glycol di-(meth)acrylate, pentaerythritol tri-(meth)acrylate, trimethylol propane tri-(meth)acrylate, ethoxylated trimethylol propane tri-(meth)acrylate, propoxylated trimethylol propane tri-(meth)acrylate, polypropylene glycol di-(meth)acrylate, hydroxy di-(meth)acrylate, polypropylene glycol di-(meth)acrylate, hydroxy di-(meth)acrylate, 2, 2-bis [(4-(acryloxy diethoxy) phenyl]propane, 2,2-bis(4-(acryloxy polyethoxy)phenyl] propane, 2,2-bis[4-(methacyloxy diethoxy)phenyl]propane, 2,2-bis[4-(methacryloxy polyethoxy)phenyl]propane, and the mixtures thereof.

\* \* \* \* \*